United States Patent

Schoofs et al.

[11] Patent Number: 5,369,308
[45] Date of Patent: Nov. 29, 1994

[54] POWER TRANSISTOR SWITCHING CIRCUIT WITH CONTROLLED TURN-OFF

[75] Inventors: Franciscus A. C. M. Schoofs, Eindhoven; Johan C. Halberstadt, Nijmegen, both of Netherlands

[73] Assignee: U.S. Philips Corporation, New York, N.Y.

[21] Appl. No.: 10,965

[22] Filed: Jan. 29, 1993

[30] Foreign Application Priority Data

Feb. 3, 1992 [EP] European Pat. Off. ............ 92200296

[51] Int. Cl.$^5$ ............................................ H03K 17/56
[52] U.S. Cl. ..................... 327/427; 361/101; 363/97; 327/478; 327/438; 327/374
[58] Field of Search ............... 307/571, 584, 637, 239; 361/93, 94, 100, 101; 363/19, 20, 21, 97

[56] References Cited

U.S. PATENT DOCUMENTS

| 4,092,710 | 5/1978 | Wadsworth | 363/19 |
| 4,581,540 | 4/1986 | Guajardo | 307/584 |
| 5,006,949 | 4/1991 | Guajardo | 361/18 |

Primary Examiner—William L. Sikes
Assistant Examiner—Jim Dudek
Attorney, Agent, or Firm—Bernard Franzblau

[57] ABSTRACT

A power transistor switching circuit includes a switching transistor. A switching signal triggers a control device which, via a delay device and a control amplifier applies a first control signal to a control electrode of the switching transistor. A thyristor is coupled to the control electrode of the switching transistor. The thyristor has a first trigger gate and a second trigger gate. A measuring circuit generates a measuring signal proportional to the current in the switching transistor. A comparison device compares the measuring signal with a reference signal for applying a second trigger signal to the thyristor second trigger gate. The control device includes a further control amplifier having an input coupled to the switching signal and an output which applies a further control signal to the first trigger gate. The delay device delays the first control signal with respect to the further control signal. When the switching transistor is turned on, the further control amplifier and the delay device prevent unwanted triggering of the thyristor due to the high impedance of the signal source which supplies the second trigger signal.

12 Claims, 1 Drawing Sheet

POWER TRANSISTOR SWITCHING CIRCUIT WITH CONTROLLED TURN-OFF

BACKGROUND OF THE INVENTION

This invention relates to an arrangement for turning on and turning off a power transistor, comprising:

a switching transistor having a first and a second main electrode which constitute a main current conductance path of the switching transistor, and a control electrode for a control signal for controlling the conductance of the main current conductance path of the switching transistor;

a control device comprising a control amplifier having an input which is coupled to a switching signal terminal for connection to a switching signal and an output for applying the control signal to the control electrode of the switching transistor;

a thyristor having a first main electrode and a second main electrode which constitute a main current conductance path of the thyristor, which path is coupled to the control electrode of the switching transistor, and a first trigger gate and a second trigger gate for receiving a first trigger signal and a second trigger signal, respectively;

measuring means for generating a measuring signal which is proportional to a current flowing through the main current conductance path of the switching transistor; and comparison means for comparing the measuring signal with a reference signal and for applying the second trigger signal to the second trigger gate of the thyristor in response to the comparison of the measuring signal and the reference signal.

An arrangement of this type is known from U.S. Pat. No. 5,006,949, FIG. 1. In this known arrangement the switching transistor is an N-channel MOS transistor whose second main electrode or drain is connected to the positive terminal of a power supply source via a load and whose first main electrode or source is connected to the negative terminal of the power supply source via a measuring resistor. A measuring voltage is produced across this measuring resistor, which voltage is proportional to the current flowing through the load and through the main current conductance path of the switching transistor as soon as the control amplifier applies a positive going control signal to the control electrode or gate of the switching transistor at the command of the switching signal. A thyristor is arranged across the series arrangement of the measuring resistor and the gate-source junction of the switching transistor, which thyristor is triggered by means of a trigger signal as soon as the current through the main current conductance path of the switching transistor exceeds a given value. To this end the second trigger gate, or cathode gate, of the thyristor is connected by means of a current-limiting resistor to the junction point of the measuring resistor and the source of the switching transistor, while the second main electrode, or cathode, of the thyristor is connected to the junction point of the measuring resistor and the negative terminal of the power supply source. The first main electrode, or anode, of the thyristor is connected to the gate of the switching transistor and the first trigger gate of the thyristor, or anode gate, is connected to the anode by means of a damping resistor so as to damp the trigger sensitivity of the thyristor. Upon triggering, the thyristor short-circuits the control signal at the gate of the switching transistor via the main current conductance path constituted by the anode and cathode. Thus, the switching transistor is protected from too large currents which may occur, for example, upon a short-circuit in the load. The thyristor can be considered to be a bipolar semiconductor element which is composed of a PNP transistor and an NPN transistor. The emitter, base and collector of the PNP transistor are connected to the anode, anode gate and cathode gate, respectively, of the thyristor, and the emitter, base and collector of the NPN transistor are connected to the cathode, cathode gate and anode gate, respectively, of the thyristor. As soon as the measuring voltage across the measuring resistor exceeds the base-emitter threshold voltage of the NPN transistor, the thyristor is triggered.

In the known arrangement the thyristor is triggered only in the case of emergency. The switching transistor is normally turned off also at the command of the switching signal. In an adapted form the known arrangement is also usable in switched-mode power supplies in which the load is constituted by the primary winding of a transformer. In this case the switching transistor is first turned on so that the current through the primary winding increases and is subsequently turned off again as soon as the current through the primary winding exceeds a given value. This value is variable and is controlled by means of a system rendering the voltage supplied by the switched-mode power supply independent of, inter alia, the load. The switching transistor is turned on by applying a control signal to the control electrode of the switching transistor at the command of the switching signal having the character of a set signal. The switching transistor is turned off by triggering the thyristor with the cathode trigger signal which has the character of a reset signal. To be able to control the turn-off value of the current through the switching transistor in the known arrangement, the measuring resistor has to be variable. In view of the generally small ohmic value of the measuring resistor, such a solution is impractical and difficult to integrate on a semiconductor body. By means of a sense transistor the current through the switching transistor can be scaled to a smaller value and converted to a measuring voltage by means of a correspondingly larger variable measuring resistor. Such variable measuring resistors are suitable for integration on a semiconductor body, but this is still a complicated solution. However, variable current sources, voltage current converters and current mirrors are electronic components which can be integrated relatively easily. For example, the current through the sense transistor can be compared with a variable reference current by means of a current mirror. As soon as the current through the sense transistor is larger than the reference current, a current is generated which may be used as a trigger current for the cathode gate of the thyristor. Since the trigger signal for the cathode gate now has the shape of a current and is supplied by a source having a relatively high impedance, a problem presents itself. A parasitic capacitor having a value which is determined, inter alia, by the sum of the collector-base capacitances of the PNP and NPN transistors is present between the anode gate and the cathode gate of the thyristor. In the known arrangement this parasitic capacitor is charged via the series arrangement of the damping resistor between the anode and the anode gate and the current-limiting resistor between the cathode gate and the measuring resistor during the period when the control voltage at the gate of the switching transistor is positive. The damping resistor and the current-limiting resistor have relatively small values and the voltage drop across these resistors due to charging the parasitic capacitor is too small to trigger the thyristor. However, if the impedance from which the cathode gate is driven is very large, as is the case when triggering from a current source, the charge current will find a path to the base of the NPN transistor. The NPN transistor becomes conductive and will amplify the parasitic capacitance which is present at the anode gate by a factor as a result of the Miller effect. The amplification is dependent on the current gain (beta) of the NPN transistor. This has a dual result. On the one hand the output of the control amplifier is capacitively loaded to a larger extent when the switching signal for the switching transistor is generated and may consequently exceed the output current which can be maximally supplied by the control amplifier. On the other hand the charge current of the amplified parasitic capacitance will generate a larger voltage drop across the damping resistor so that the thyristor may be triggered inadvertently. A solution could be to reduce the damping resistor by a factor of beta so as to avoid unwanted triggering when the switching signal occurs. However, this leads to a thyristor which is triggerable with great difficulty. At the instant when the switching transistor is turned off, the thyristor will have to be triggered. It is no problem to render the NPN transistor conducting. The collector current of the NPN transistor substantially flows through the damping resistor and is supplied by the output of the control amplifier. This amplifier must be able to supply a large current in order to generate a base-emitter threshold voltage across the small damping resistor so as to render the PNP transistor also conducting and thus trigger the thyristor. It is not a satisfactory solution to give the damping resistor a very large value or to omit it because the thyristor will then be much too sensitive and will be triggered inadvertently whenever the positive switching signal occurs.

SUMMARY OF THE INVENTION

The invention has, inter alia, for its object to provide an arrangement for turning on and turning off a power transistor which is more suitable for triggering at the cathode gate front a high-impedance source. According to the invention the arrangement for turning on and turning off a power transistor described in the opening paragraph is therefore characterized in that the control device further comprises:
a further control amplifier having an input which is coupled to the switching signal terminal and an output which is coupled to the first trigger gate of the thyristor for applying a further control signal to the first trigger gate; and
delay means for delaying the control signal of the control amplifier with respect to the further control signal of the further control amplifier.

The further control amplifier applies a further control signal to the first trigger gate (anode gate in the example described above) which, after the occurrence of a jump in the switching signal, reaches its final value at an earlier instant than the control signal which is applied by the first-mentioned control amplifier to the first main electrode of the thyristor (anode in the example). The damping resistor is absent so that a thyristor having a large trigger sensitivity is obtained, while the delay between the two control signals prevents the thyristor from being triggered inadvertently when the switching transistor is turned on. Furthermore, the overall capacitive load is spread over two control amplifiers, the further control amplifier charging the amplified parasitic capacitor and the first-mentioned control amplifier charging the parasitic capacitance which is present at the control electrode of the switching transistor. The delay means may be built in the design. This is the case, for example, if the parasitic capacitance at the first main electrode of the thyristor (anode) is larger than the parasitic capacitance at the first trigger gate (anode gate) of the thyristor and if the two control amplifiers also have mutually equal properties. However, if this should not be the case, a further embodiment of an arrangement for turning on and turning off a power transistor according to the invention may be characterized in that the delay means comprise a low-pass filter which is connected between the switching signal terminal and the input of the control amplifier.

The additionally required delay of the first-mentioned control signal is obtained by first delaying the switching signal for the first-mentioned control amplifier and then amplifying it. In that case the output of this amplifier is not needlessly loaded capacitively.

Another embodiment of an arrangement for turning on and turning off a power transistor according to the invention is characterized in that the control device further comprises a feedback amplifier, an input of which is connected to the output of the further control amplifier and an output of which is connected to the input of the further control amplifier for positively feeding back the further control signal to the input of the further control amplifier.

The further control amplifier and the feedback amplifier constitute a flipflop which memorizes the value of the switching signal (set signal) at the switching signal terminal. It is now sufficient to use a short switching signal for turning on the switching transistor. This is advantageous when the arrangement is used for turning on and turning off a power transistor in a switched-mode power supply in which the duty cycle of the switching transistor may vary considerably, as in, for example, a self-oscillating power supply (SOPS). The flipflop is reset by triggering the thyristor, with the first trigger gate short-circuiting the output of the further control amplifier. Since the short switching signal (set signal) is not active at that instant, this short-circuit does not involve a needless load of the two control amplifiers.

BRIEF DESCRIPTION OF THE DRAWING

These and other aspects of the invention will be elucidated and described with reference to the accompanying drawing in which.

DESCRIPTION OF THE PREFERRED EMBODIMENTS

Figure 1:
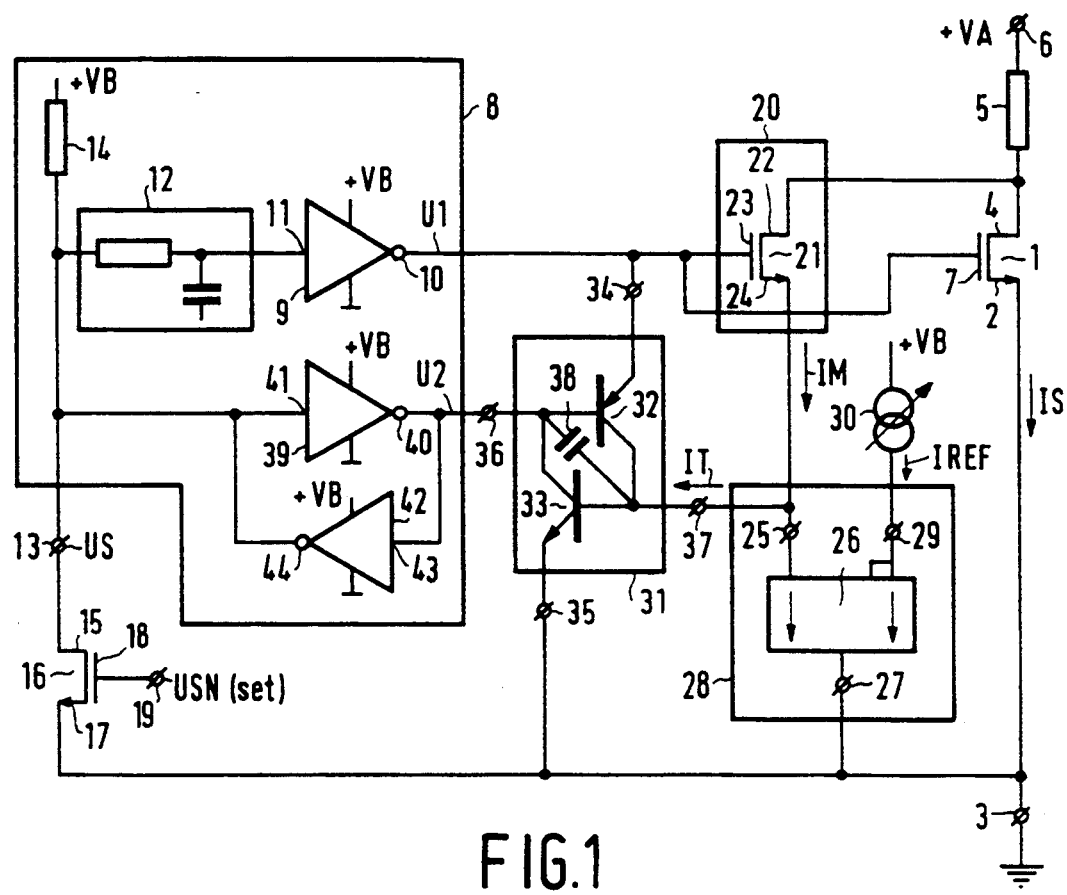
FIG. 1 shows an embodiment of an arrangement for turning on and turning off a power transistor according to the invention.

FIG. 1 shows an embodiment of an arrangement for turning on and turning off a power transistor according to the invention. The power transistor is an NMOS switching transistor 1 whose first main electrode, or source, 2 is connected to a negative power supply terminal 3 which is connected to ground. The second main electrode, or drain, 4 is connected via a load 5 to a positive power supply terminal 6 to which a positive power supply voltage VA is connected. The switching transistor 1 is turned on, i.e. rendered conducting by means of a control signal U1, which is positive with respect to ground, at the control electrode, or gate, 7 of the switching transistor 1. The control signal U1 originates from a control device 8 comprising a first inverting control amplifier 9 whose output 10 is connected to the gate 7 of the switching transistor 1 and whose input 11 is connected via an optional low-pass filter 12 to a switching signal terminal 13 to which a switching signal US is connected which is negative when the switching transistor 1 is being turned on. The switching signal terminal 13 is connected to a resistor 14 and to the drain 15 of an NMOS transistor 16 whose source 17 is connected to ground and whose gate 18 is connected to an input terminal 19 to which a switching signal USN, which is inverted with respect to the switching signal US, is connected. Transistor 16 and resistor 14 operate as an inverting buffer and, if desired, may be omitted. The first inverting control amplifier 9 and the resistor 14 are connected to a suitable positive power supply voltage VB.

When the switching transistor 1 is turned on, a current IS will start flowing through the load 5 and through the main current conducting path of switching transistor 1, which path is constituted by the source 2 and the drain 4. The current IS is measured by means of measuring means 20 in the form of, for example, an NMOS sense transistor 21 which is a smaller version of the switching transistor 1. The drain 22 and the gate 23 of the sense transistor 21 are interconnected to the corresponding electrodes 4 and 7, respectively, of the switching transistor 1. A measuring current IM which is proportional to the current IS through the switching transistor 1 flows through the sense transistor 21. The measuring current IM is compared in comparison means 28 with a reference current IREF which is supplied by a reference current source 30. In response to the comparison the comparison means 28 generate a trigger current IT. The comparison means 28 are provided with a current mirror 26, an output current terminal 25 of which is connected to the source 24 of transistor 21 and a common terminal 27 of which is connected to the source 2 of the switching transistor 1. The current mirror 26 also has an input current terminal 29 to which the reference current source 30 is connected. Dependent on the use of the arrangement for turning on and turning off a power transistor, the current source 30 may be formed as a variable current source. The measuring current IM completely disappears in the output current terminal 25 of the current mirror 26 as long as the measuring current IM is smaller than or equal to the reference current IREF. However, as soon as the measuring current IM exceeds the reference current IRFEF, a difference current becomes available with which a thyristor 31 is triggered, which short-circuits the gate 7 of switching transistor 1 to the drain 2 of the switching transistor 1 and thus turns off this transistor. By varying the reference current IREF, the current IS, at which the switching transistor is turned off, can be controlled.

The thyristor 31 may be considered to be composed of a bipolar PNP transistor 32 and a bipolar NPN transistor 33, the emitter of the PNP transistor 32 being the first main electrode, or anode, 34 of the thyristor 31 and the emitter of the NPN transistor being the second main electrode, or cathode, 35 of the thyristor 31, while the collector of the NPN transistor, interconnected to the base of the PNP transistor 32, constitutes the first trigger gate, or anode gate, 36 of the thyristor 31 and the collector of the PNP transistor 32, interconnected to the base of the NPN transistor 33, constitutes the second trigger gate, or cathode gate, 37 of the thyristor 31. The anode 34 and the cathode 35 are connected to the gate 7 and the source 2, respectively, of the switching transistor 1. The cathode gate 37 is connected to the output current terminal 25 of the current mirror 26 and receives a trigger signal in the shape of a trigger current IT which will flow to the cathode gate 37 as soon as the measuring current IM exceeds the reference current IREF.

Figure 2:
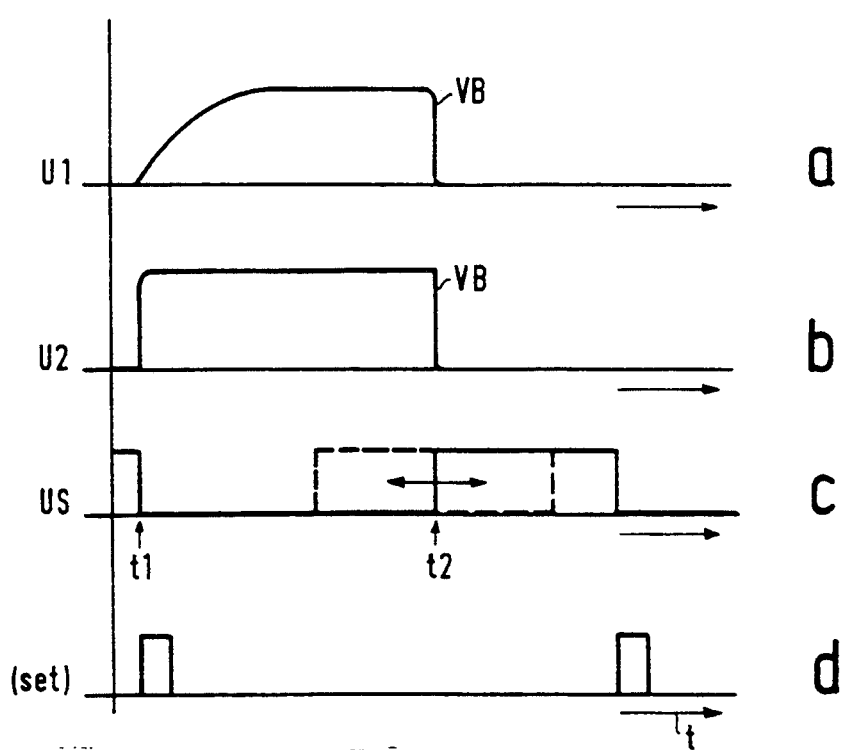
FIG. 2 shows signal waveforms to explain the operation of the arrangement shown in FIG. 1.

The positive jump in the control signal U1 at which the switching transistor is turned on should not cause the thyristor 31 to self-trigger. This self-triggering is caused by a parasitic capacitance 38 which is present across the collector-base junctions of the transistors 32 and 33. This can be prevented by arranging a damping resistor between the anode 34 and the anode gate 36 of the thyristor 31. The charge current through capacitance 38 then flows to the base of NPN transistor 33 via the damping resistor and the capacitance 38. A direct current path to ground is absent due to the high impedance level at the current output terminal 25 of current mirror 26. The NPN transistor will start conducting and will increase the apparent value of the capacitance 38 by a factor which is determined by its current gain (beta). This is the known Miller effect. The increased capacitance 38 will cause a correspondingly larger charge current to flow through the damping resistor. To prevent the base-emitter voltage of the PNP transistor 32 from becoming so large that it starts conducting and thereby triggering the thyristor, the value of the damping resistor should be chosen to be relatively small. As the thyristor 31 should be triggered when a given value of the current IS is reached, the first control amplifier 9 will have to be able to supply a relatively large current for generating a sufficient voltage drop across the small damping resistor so as to render the base-emitter junction of the PNP transistor 32 conducting. This is a problem and to obviate this problem the control device 8 comprises a second inverting control amplifier 39, the output 40 of which is connected to the anode gate 36 of the thyristor 31 and the input of which is connected to the switching signal terminal 13. The low-pass filter 12 causes a delay between the positive jumps in the control signal U1 at the output 10 of the first control amplifier 9 and in the control signal U2 at the output 40 of the second control amplifier 39 as is shown in FIGS. 2a and 2b. In this way the base-emitter junction of the PNP transistor 32 is always held reverse biased when the switching transistor 1 is turned on without using a current consuming damping resistor. The delay may also be obtained by the dimensioning of the parasitic capacitances which are seen at the outputs 10 and 40. An extra delay is only necessary when the parasitic capacitance at output 10 of the first control amplifier 9 charges too fast with respect to the charging of the parasitic capacitance at output 40 of the second control amplifier 39. This extra delay may be obtained, for example, by means of the low-pass filter 12. The first control amplifier 9 and the second control amplifier 39 may then be otherwise identical. An alternative solution is to choose the trip levels of the control amplifiers to be different, such that the output 40 of the second control amplifier 39 is triggered to a higher value at a higher input voltage than the output 10 of the first control amplifier 9.

FIG. 2c shows the switching signal US at the switching signal terminal 13, which signal occurs when the arrangement is used for turning on and turning off a power transistor in a switched-mode power supply in which the load 5 is the primary winding of a transformer (not shown in FIG. 1) and in which the current IS increases after the switching transistor 5 has been turned on. In these types of supplies the switching transistor 1 is turned off again as soon as the current IS has reached a given value. The value at which the transistor is turned off is variable and is controlled by means of a control system (not shown in FIG. 1) which renders, for example, the output voltage of the switched-mode power supply independent of the current to be supplied to a load (not shown in FIG. 1) by varying the reference current IREF of the reference current source 30 in a way which will not be further described. The switching signal US turns on the switching transistor 1 at instant t1 and the switching transistor 1 is turned off by the thyristor 31 at a variable instant t2. It is then desired that the switching signal US also changes its value at instant t2 so as to prevent a needless short-circuit of the control amplifiers 9 and 39. This can be achieved in an advantageous manner by means of an inverting feedback amplifier 42, the input 43 of which is connected to the output 40 of the second control amplifier 39 and the output 44 of which is connected to the input 41 of the second control amplifier 39. The amplifiers 39 and 42 jointly constitute a flipflop. A short pulse (set) can be applied to the switching voltage terminal 13 or to the input terminal 19 so as to turn on the switching transistor 1. This is shown in FIG. 2d. The switching transistor 1 is turned off when the thyristor 31 is triggered, with the output 40 being turned down. The feedback amplifier 42 retains this state by supplying a positive signal to the inputs 41 and 11. The outputs 40 and 10 then remain low until the next set pulse.

The invention is not limited to the embodiment shown in FIG. 1. The NMOS transistors shown may alternatively be PMOS transistors, bipolar PNP or NPN transistors, taking the polarity of the power supply voltages and a possible inverted manner of connecting the thyristor 31 into account. Moreover, the way in which the trigger signal for the cathode gate 37 of the thyristor is derived from the current IS through the switching transistor may also be realized differently. An example is a resistor arranged in series with the source of the switching transistor or in series with the source of the sense transistor, and a comparator having a high output impedance so as to compare the voltage across the resistor with a variable reference voltage and to supply the trigger current to the cathode gate of the thyristor.

We claim:

1. An arrangement for switching a power transistor, comprising:

a switching transistor having a first and a second main electrode which constitute a main current conductance path of the switching transistor, and a control electrode for a control signal (U1) for controlling the conductance of the main current conductance path of the switching transistor, a control device comprising a control amplifier having an input coupled to a switching signal terminal for a switching signal (US) and an output for applying the control signal (U1) to the control electrode of the switching transistor, a thyristor having a first main electrode and a second main electrode which constitute a main current conductance path of the thyristor, which path is coupled to the control electrode of the switching transistor, and a first trigger gate and a second trigger gate for connecting a first trigger signal and a second trigger signal (IT), respectively, measuring means for generating a measuring signal (IM) which is proportional to a current (IS) flowing through the main current conductance path of the switching transistor, comparison means for comparing the measuring signal (IM) with a reference signal (IREF) and for applying the second trigger signal (IT) to the second trigger gate of the thyristor in response to the comparison of the measuring signal and the reference signal, wherein the control device further comprises:

a further control amplifier having an input coupled to the switching signal terminal and an output coupled to the first trigger gate, and of the thyristor for applying a further control signal (U2) to the first trigger gate, delay means for delaying the control signal (U1) of the control amplifier with respect to the further control signal (U2) of the further control amplifier.

2. An arrangement as claimed in claim 1, wherein the delay means comprise a low-pass filter which is connected between the switching signal terminal and the input of the control amplifier.

3. An arrangement as claimed in claim 1 wherein the control device further comprises a feedback amplifier having an input connected to the output of the further control amplifier and an output connected to the input of the further control amplifier for positively feeding back the further control signal (U2) to the input of the further control amplifier.

4. An arrangement as claimed in claim 3, wherein the measuring means comprise: a sense transistor having a first and a second main electrode and a control electrode, which second main electrode and control electrode are connected to corresponding electrodes of the switching transistor, and wherein the comparison means comprise a current mirror having an input current terminal coupled to a reference current source, an output current terminal which is coupled to the first main electrode (24) of the sense transistor and to the second trigger gate of the thyristor and a common terminal coupled to the first main electrode of the switching transistor.

5. An arrangement as claimed in claim 2 wherein the control device further comprises a feedback amplifier having an input connected to the output of the further control amplifier and an output connected to the input of the further control amplifier fox positively feeding back the further control signal (U2) to the input of the further control amplifier.

6. An arrangement as claimed in claim 1, wherein the measuring means comprise: a sense transistor having a first and a second main electrode and a control electrode, which second main electrode and control electrode are connected to corresponding electrodes of the switching transistor, and wherein the comparison means comprise a current mirror having an input current terminal coupled to a reference current source, an output current terminal coupled to the first main electrode of the sense transistor and to the second trigger gate of the thyristor, and a common terminal coupled to the first main electrode of the switching transistor.

7. An arrangement as claimed in claim 1 wherein said reference signal is supplied by a source of variable current coupled to an input of the comparison means.

8. A circuit for switching a power transistor on and off comprising:
   a switchable power transistor coupled to a load circuit so as to switch current to the load circuit,
   a switching signal input terminal,
   a control device comprising first and second control amplifiers each having an input coupled to said input terminal and with an output of the first control amplifier coupled to a control electrode of the power transistor for supplying thereto a first control signal for triggering the power transistor into conduction,
   a thyristor-like device having first and second main electrodes defining a main current path that is coupled to the control electrode of the power transistor, said device including first and second control terminals,
   measuring means coupled to the load circuit for deriving a measuring signal proportional to load current,
   means for deriving a reference signal that determines the level of load current for causing turn-off of the power transistor,
   means for comparing the measuring signal with the reference signal to supply a trigger signal to the second control terminal of said thyristor-like device,
   means coupling an output of the second control amplifier to said first control terminal to supply thereto a second control signal, and
   delay means coupled to at least one of said control amplifiers so as to delay the first control signal with respect to the second control signal.

9. A switching circuit as claimed in claim 8 wherein said reference signal deriving means includes a source of reference current and said measuring means produces a measuring signal current, and said comparing means comprises;
   a current mirror having an input coupled to said reference current source, an output coupled to said measuring means to receive said measuring signal current, said output also being coupled to said second control terminal so as to supply it with said trigger signal, and a common terminal coupled to a point of reference voltage.

10. A switching circuit as claimed in claim 9 wherein said measuring means comprises;
   a sense transistor coupled in shunt with the power transistor to said output of the current mirror and having a control electrode directly coupled to the control electrode of the power transistor.

11. A switching circuit as claimed in claim 8 wherein said delay means comprise a low pass filter connected in cascade with said first control amplifier.

12. A switching circuit as claimed in claim 8 wherein said control device further comprises a positive feedback amplifier coupled in anti-parallel with said second control amplifier.

* * * * *